(12) United States Patent
Narita

(10) Patent No.: US 7,312,666 B2
(45) Date of Patent: Dec. 25, 2007

(54) PLL CIRCUIT CONFIGURED TO DISTRIBUTE ITS LOOP CONTROL SIGNAL TO CDR CIRCUITS

(75) Inventor: Yuki Narita, Chiba (JP)

(73) Assignee: Kawasaki Microelectronics, Inc., Chiba (JP)

( * ) Notice: Subject to any disclaimer, the term of this patent is extended or adjusted under 35 U.S.C. 154(b) by 142 days.

(21) Appl. No.: 11/357,939

(22) Filed: Feb. 22, 2006

(65) Prior Publication Data

US 2006/0192622 A1 Aug. 31, 2006

(30) Foreign Application Priority Data

Feb. 28, 2005 (JP) .............................. 2005-053202

(51) Int. Cl.
*H03L 7/22* (2006.01)
*H03L 7/10* (2006.01)

(52) U.S. Cl. ........................ 331/16; 331/17; 375/376; 327/156

(58) Field of Classification Search ................ 375/376; 331/16, 17; 327/156
See application file for complete search history.

(56) References Cited

U.S. PATENT DOCUMENTS 4,494,021 A * 1/1985 Bell et al. .................... 327/262
6,927,611 B2 * 8/2005 Rhee et al. ................... 327/149
2004/0228636 A1 * 11/2004 Pathak et al. ................ 398/155
2007/0047689 A1 * 3/2007 Menolfi et al. .............. 375/376
2007/0058768 A1 * 3/2007 Werner ......................... 375/376
2007/0153950 A1 * 7/2007 Dosaka ......................... 375/375

FOREIGN PATENT DOCUMENTS

| JP | A-11-205133 | 7/1999 |
| JP | A-2000-243939 | 9/2000 |
| JP | A-2004-15032 | 1/2004 |

* cited by examiner

Primary Examiner—Joseph Chang
(74) Attorney, Agent, or Firm—Oliff & Berridge, PLC

(57) ABSTRACT

A semiconductor integrated circuit includes a phase-locked loop (PLL) circuit configured to generate an oscillation output signal synchronized with a reference clock and a plurality of clock and data recovery (CDR) circuits configured to adjust a phase of the oscillation output signal and a phase of serial data. The PLL circuit converts a voltage output from a loop filter, the voltage functioning to control an oscillation frequency of an oscillator, into a current and delivers the converted current to the plurality of CDR circuits. Therefore, in a case where clock signals used in a plurality of serial transmission channels are synchronized with one another, limitations on layout of clock wiring from the PLL circuit to the CDR circuits and the occurrence of jitter are reduced.

10 Claims, 11 Drawing Sheets

PLL CIRCUIT CONFIGURED TO DISTRIBUTE ITS LOOP CONTROL SIGNAL TO CDR CIRCUITS

BACKGROUND

The present invention relates to semiconductor integrated circuits, and in particular, to a semiconductor integrated circuit that incorporates a phase-locked loop (PLL) circuit and a plurality of clock and data recovery (CDR) circuits for synchronization of clocks used in a plurality of serial transmission channels.

In the network field, a transmission technology based on serial transmission has been developed. Currently, serial transmission in the network field mainly uses a technique of embedding clock information (encoded data) in a series of data, transmitting the data at the transmitting side and decoding a clock from the transmitted data at the receiving side for synchronization between transceivers.

Network devices usually include PLL circuits and CDR circuits in order to synchronize clocks between remote places connected over a network.

FIG. 7 is a block diagram of a known conventional PLL circuit. A PLL circuit 70 includes a phase-frequency detector (PFD) 71, a charge pump (CP) 72, a loop filter (LF) 73, a voltage-to-current converter (V-I) 74, an oscillator (OSC) 75, and a frequency divider (DIV) 76. When a reference clock REFCLK is externally input to the PLL circuit 70, the phase frequency detector 71 compares the reference clock REFCLK to a divided signal DIVCLK into which the frequency of an oscillation output signal GCLK from the oscillator 75 is divided to detect the phase and frequency differences therebetween. The phase frequency detector 71 outputs an up pulse signal UP or a down pulse signal DOWN to the charge pump 72, depending on the phase difference and frequency difference. The charge pump 72 charges or discharges the loop filter 73 on the basis of the up pulse signal UP or the down pulse signal DOWN. A control voltage VTUNE determined by an electric charge stored in a capacitance of the loop filter 73 is converted into a frequency control current ICTRL in the voltage-to-current converter 74. The frequency control current ICTRL is used to control an oscillation frequency of the oscillator 75.

In this way, the phase difference and the frequency difference between the reference clock REFCLK and the oscillation output signal GCLK from the oscillator 75 are detected, and in accordance with the detected values, the oscillation frequency of the oscillator 75 is repeatedly changed, so that the phase and frequency of the reference clock REFCLK and the phase and frequency of the oscillation output signal GCLK are synchronized with each other.

FIG. 8 is a block diagram of a conventional serial-to-parallel converter (S/P) for converting serial data into parallel data by using a CDR circuit. As shown in FIG. 8, a serial-to-parallel converter 80 includes a deserializer 84 and a CDR circuit 81 having a phase detector (PD) 82 and a phase control block 83. The phase detector 82 detects the leading edge and the trailing edge of serial data signals RXP and RXN (which are differential data), and transmits to the phase control block 83 phase differences between the serial data signals RXP and RXN and clocks GCLKI, GCLKQ, GCLKIB, and GCLKQB. The clocks GCLKI, GCLKQ, GCLKIB, and GCLKQB are generated by a PLL circuit and 90 are degrees out of phase with the adjacent clock. The phase control block 83 shifts the phases of the clocks GCLKI, GCLKQ, GCLKIB, and GCLKQB such that the phases of these clocks are synchronized with the phases of the serial data signals RXP and RXN. Clocks FCLKI and FCLKIB, whose phases have been adjusted by the phase control block 83, are transmitted to the deserializer 84. The deserializer 84 converts the serial data into parallel data in synchronism with the clocks transmitted from the phase control block 83.

FIG. 9 is a block diagram of another conventional serial-to-parallel converter (S/P). A serial-to-parallel converter 90 includes, instead of the phase control block 83 shown in FIG. 8, a coarse loop 92, which is similar to a PLL circuit, and a fine loop 91 for performing control from a phase detector, and a deserializer 93. The coarse loop 92 operates in the same manner as the PLL circuit described above, i.e., compares a low-frequency reference clock REFCLK and a divided signal DIVCLK into which the frequency of an oscillation output signal generated in an oscillator 915 is divided to detect a phase difference therebetween and controls an oscillation frequency of the oscillator 915. If the frequency of the reference clock REFCLK is equal to the frequency of serial data signals RXP and RXN, the fine loop 91 performs an adjustment such that the phases of high-speed clocks GCLKI, GCLKQ, GCLKIB, and GCLKQB which are generated in the oscillator 915, are coincident with the phases of the serial data signals. The high-speed clocks GCLKI and GCLKIB, whose phases have been adjusted in the fine loop 91, are transmitted to the deserializer 93. The deserializer 93 then converts the serial data into parallel data in synchronism with the high-speed clocks GCLKI and GCLKIB from the fine loop 91.

With increases in the amount of traffic on networks in recent years, a technique of binding a plurality of serial transmission channels is used. In this case, it is necessary to perform data communications while the frequencies of clocks in the plurality of serial transmission channels are coincident with each other. The technique is broadly classified into two methods described below.

A first method is a method of supplying a clock from a single PLL circuit to each of the plurality of channels. FIG. 10 is a schematic diagram illustrating this method. Serial-to-parallel converters 80 in FIG. 10 are similar to the serial-to-parallel converter 80 shown in FIG. 8. This method has the advantage of being capable of entirely synchronizing the frequencies of clocks in the channels.

However, as the line becomes finer in semiconductor process technology, line widths and spaces between lines are reduced, and therefore, line resistance and capacitance between lines tend to increase. As a result, as the clock frequency increases its speed from several gigabytes to several tens of gigabytes, deterioration of signal quality, such as a decrease in clock amplitude, an occurrence of jitter, and the like, tends to occur in channels that are remote from each other in layout. To address this problem, a buffer inserted into a path of clock wiring or a shielding of wire is required. This imposes limitations on layout of clock wiring on a semiconductor chip.

A second method is a method of arranging a serial-to-parallel converter such as the one shown in FIG. 9 in each channel, and providing commonality among reference clocks of the serial-to-parallel converters. FIG. 11 is a schematic diagram illustrating this method. This second method can reduce clock deterioration dependent on the position on layout more than the first method because high-speed clocks are generated in each channel.

However, since a reference clock is shared in the second method, the influence of driven load capacitance is not avoided. Therefore, limitations on layout of clock wiring are still present, although not as much as in the high-speed clock described above. Additionally, both the layout area and power consumption are increased because a coarse loop and a fine loop are disposed in each channel. Moreover, since each coarse loop uses a low-frequency reference clock for synchronization, it is necessary to increase a frequency gain of an oscillator, which results in the occurrence of jitter.

As the second method, various techniques are discussed. For example, Japanese Unexamined Patent Application Publication No. 2000-243939 discloses a technique that allows layout of wiring for a reference clock merely by embedding a reference-clock transmission block in each channel and arranging the channels in a different sequence.

Japanese Unexamined Patent Application Publication No. 2004-015032 discloses a technique that suppresses noise within a chip by arranging a line for a reference clock in a dedicated area on an outermost section of the chip and also reduces the length of the line for the reference clock.

Japanese Unexamined Patent Application Publication No. 11-205133 discloses a technique that reduces variations in the frequency of an oscillator by providing a PLL circuit in a receiver with two loops, one loop functioning to compare a reference clock and a feedback clock and the other functioning to compare serial data and the feedback clock, switching between the two loops at start-up and at which data synchronization is performed, and suppressing a current in a tuning-current generating circuit in an oscillator when synchronization with serial data is performed.

The techniques described in Japanese Unexamined Patent Application Publication Nos. 2000-243939 and 2004-015032 can reduce limitations on layout and suppress the influence of noise caused by a circuit adjacent to a clock line, but do not solve a problem of the increase in the layout area and power consumption because a clock itself is supplied to each channel. Additionally, the problem of the occurrence of jitter remains unsolved because it is necessary to increase the gain of a voltage-controlled oscillator.

The technique described in Japanese Unexamined Patent Application Publication No. 11-205133 suppresses variations in the frequency of the oscillator and thus reduces the occurrence of jitter by not using a reference clock and reducing a tuning current when synchronization with serial data is performed. However, in a state where no serial data is input over a fixed period of time, the first loop for the reference clock is temporarily switched on and, upon receipt of serial data, the second loop is switched on again. Therefore, it is necessary to use a reference clock whose jitter is low. As a result, the problem of the limitations on layout of wiring for the reference clock, and the increase in power consumption caused by a buffer arranged in a path of distribution of the reference clock remains unsolved.

SUMMARY

It is an object of the present invention to provide a semiconductor integrated circuit that solves the above-described problems in the known art, avoids limitations on layout of clock wiring from a PLL circuit to CDR circuits when clocks used in a plurality of serial transmission channels are synchronized with each other, and reduces the occurrence of jitter.

According to an exemplary aspect of the present invention, a semiconductor integrated circuit includes a phase-locked loop (PLL) circuit and a plurality of clock and data recovery (CDR) circuits. The PLL circuit is configured to generate an oscillation output signal synchronized with a reference clock and includes a phase-frequency detector, a loop filter, an oscillator, and a voltage-to-current converter configured to convert a control voltage output from the loop filter and used for controlling an oscillation frequency of the oscillator into a current. The CDR circuits are configured to adjust a phase of the oscillation output signal with respect to a phase of serial data. The semiconductor integrated circuit also includes a path for distributing the converted current to the plurality of CDR circuits.

According to various exemplary embodiments, each of the CDR circuits may include an oscillator whose oscillation frequency is controlled on the basis of the distributed current.

According to various exemplary embodiments, each of the CDR circuits may include a current-to-voltage converter configured to convert the distributed current into a voltage, and a voltage-controlled oscillator whose oscillation frequency is controlled on the basis of the converted voltage.

As described above, a semiconductor integrated circuit according to an exemplary aspect of the present invention distributes to each channel a current for controlling an oscillation frequency (center frequency) of an oscillator in a PLL circuit, instead of distributing a clock. Therefore, no consideration is required for layout of clock wiring, which is to be considered in the known art. In other words, since a control current is not subjected to the influence of noise on wiring, such as crosstalk, no signal deterioration is present in even a CDR circuit that is remote from the PLL circuit. As a result, a line for shielding and a buffer in a path of wiring are not required. Power consumption can be reduced accordingly. Furthermore, since an oscillator in each CDR circuit may control its oscillation frequency (may adjust the phase of the oscillation frequency with respect to that of serial data) by using a mirrored current from a PLL circuit, a circuit with a reduced frequency gain can be designed, and therefore, the occurrence of jitter can be reduced.

DETAILED DESCRIPTION OF EXEMPLARY EMBODIMENTS

A semiconductor integrated circuit according to various exemplary embodiments of the present invention is described below with reference to the attached drawings.

Figure 1:
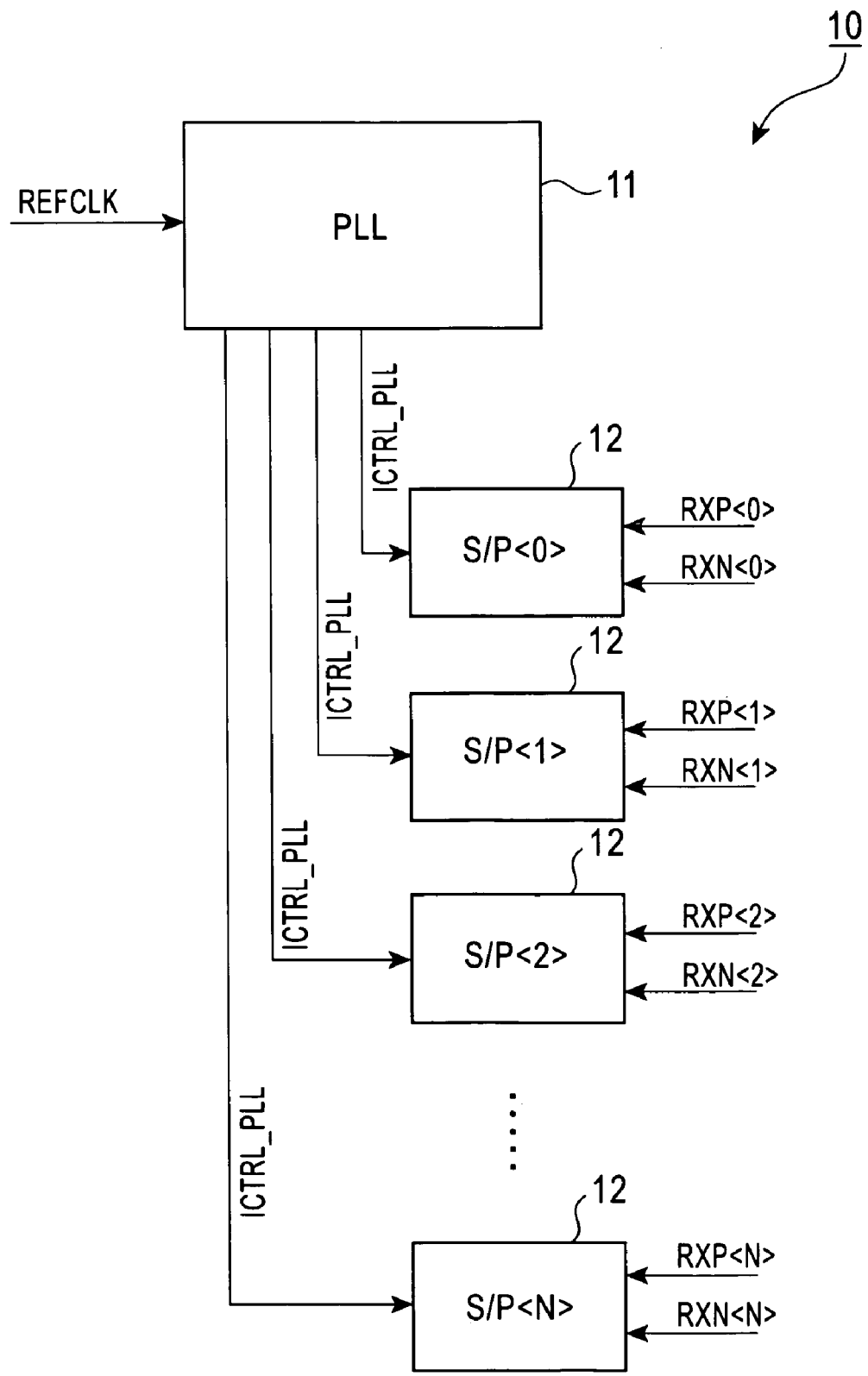
FIG. 1 is a schematic diagram of a semiconductor integrated circuit according to an exemplary embodiment of the present invention.

FIG. 1 is a schematic diagram showing an exemplary embodiment of a semiconductor integrated circuit. According to various exemplary embodiments, a semiconductor integrated circuit 10 shown in FIG. 1 includes a PLL circuit (PLL) 11 and a plurality of serial-to-parallel converters (S/Ps) 12 to which CDR circuits are applied.

According to various exemplary embodiments, the PLL circuit 11 shown in FIG. 1 receives a reference clock REFCLK and outputs a plurality of frequency control currents ICTRL_PLL having the same current value. The serial-to-parallel converters 12 (S/P<0>, . . . , S/P<N>) receive the frequency control currents ICTRL_PLL from the PLL circuit 11 and serial data signals RXP (RXP<0>, . . . , RXP<N>) and RXN (RXN<0>, . . . , RXN<N>), respectively. According to various exemplary embodiments and as described later, each of the frequency control currents ICTRL_PLL is a mirrored current of a frequency control current ICTRL_PLL into which an output voltage of a loop filter in the PLL circuit 11 is converted by a voltage-current converter, the frequency of control current being used for controlling an oscillation frequency of an oscillator. The number of the mirrored frequency control currents may be the same as that of the serial-to-parallel converters 12.

Figure 2:
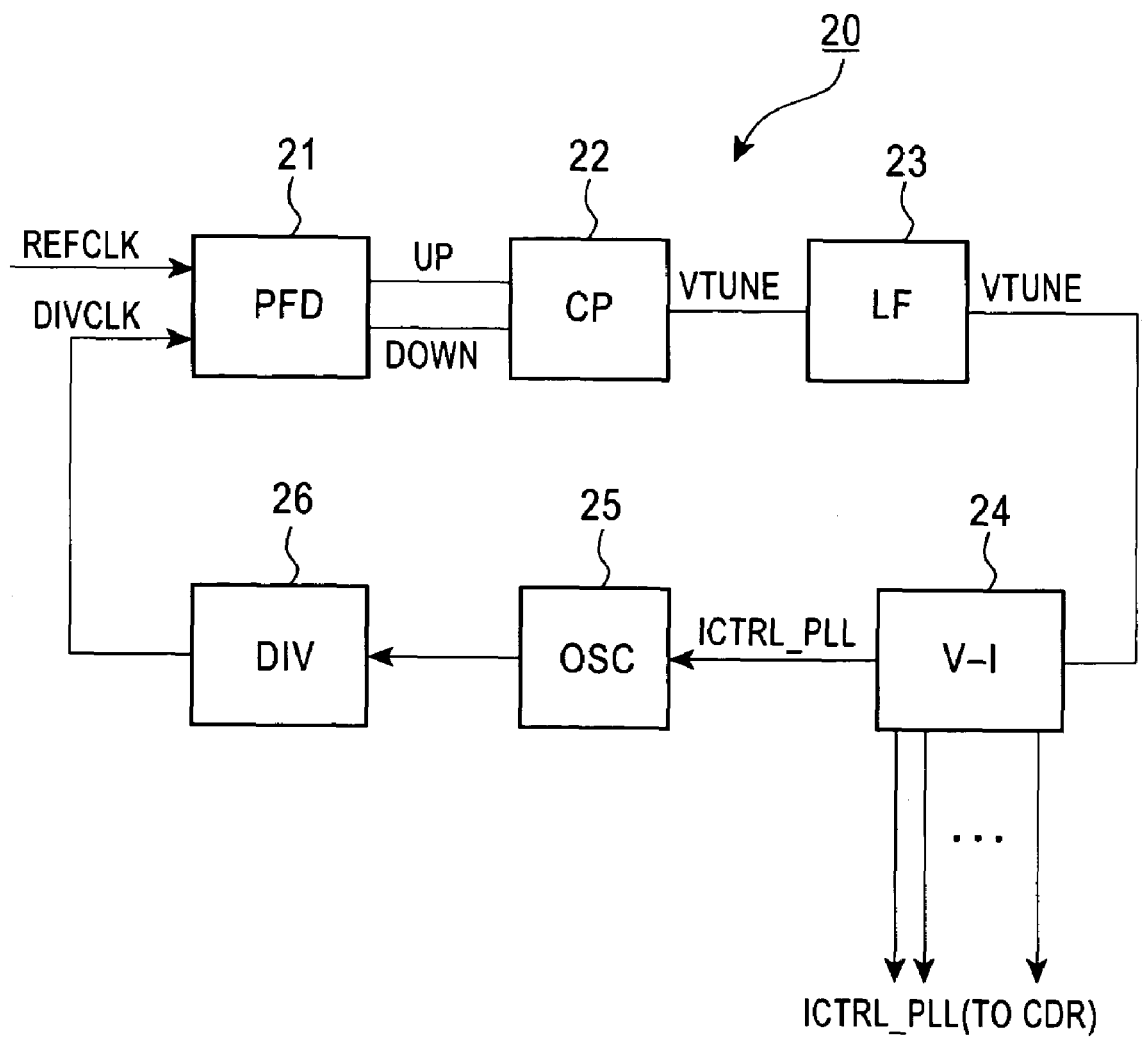
FIG. 2 is a schematic diagram of a PLL circuit used in the semiconductor integrated circuit according to an exemplary embodiment of the present invention.

FIG. 2 is a schematic diagram of a PLL circuit used in the semiconductor integrated circuit according to an exemplary embodiment of the present invention. According to various exemplary embodiments, a PLL circuit 20 (the PLL circuit 11 in FIG. 1) includes a phase-frequency detector (PFD) 21, a charge pump (CP) 22, a loop filter (LF) 23, a voltage-to-current converter (V-I) 24, an oscillator (OSC) 25, and a frequency divider (DIV) 26. The oscillator 25 is a current-controlled oscillator whose oscillation frequency is controlled on the basis of the frequency control current ICTRL_PLL.

According to various exemplary embodiments, the phase-frequency detector 21 receives a reference clock REFCLK from the outside and a divided signal DIVCLK into which the frequency of an oscillation output signal of the oscillator 25 is divided by the frequency divider 26. The phase-frequency detector 21 may then compare the reference clock REFCLK and the divided signal DIVCLK to detect the difference in phase and frequency therebetween, and may output an up pulse signal UP or a down pulse signal DOWN on the basis of the phase and frequency differences. According to various exemplary embodiments, the charge pump 22 charges or discharges a capacitance (not illustrated) in the loop filter 23 on the basis of the up pulse signal UP or the down pulse signal DOWN. Also, the loop filter 23 may generate a control voltage VTUNE for controlling the oscillator 25 from the electric charge stored in the capacitance, and the control voltage VTUNE is converted into the frequency control current ICTRL_PLL by the voltage-to-current converter 24. The oscillation frequency of the oscillator 25 is controlled on the basis of the frequency control current ICTRL_PLL.

Figure 3:
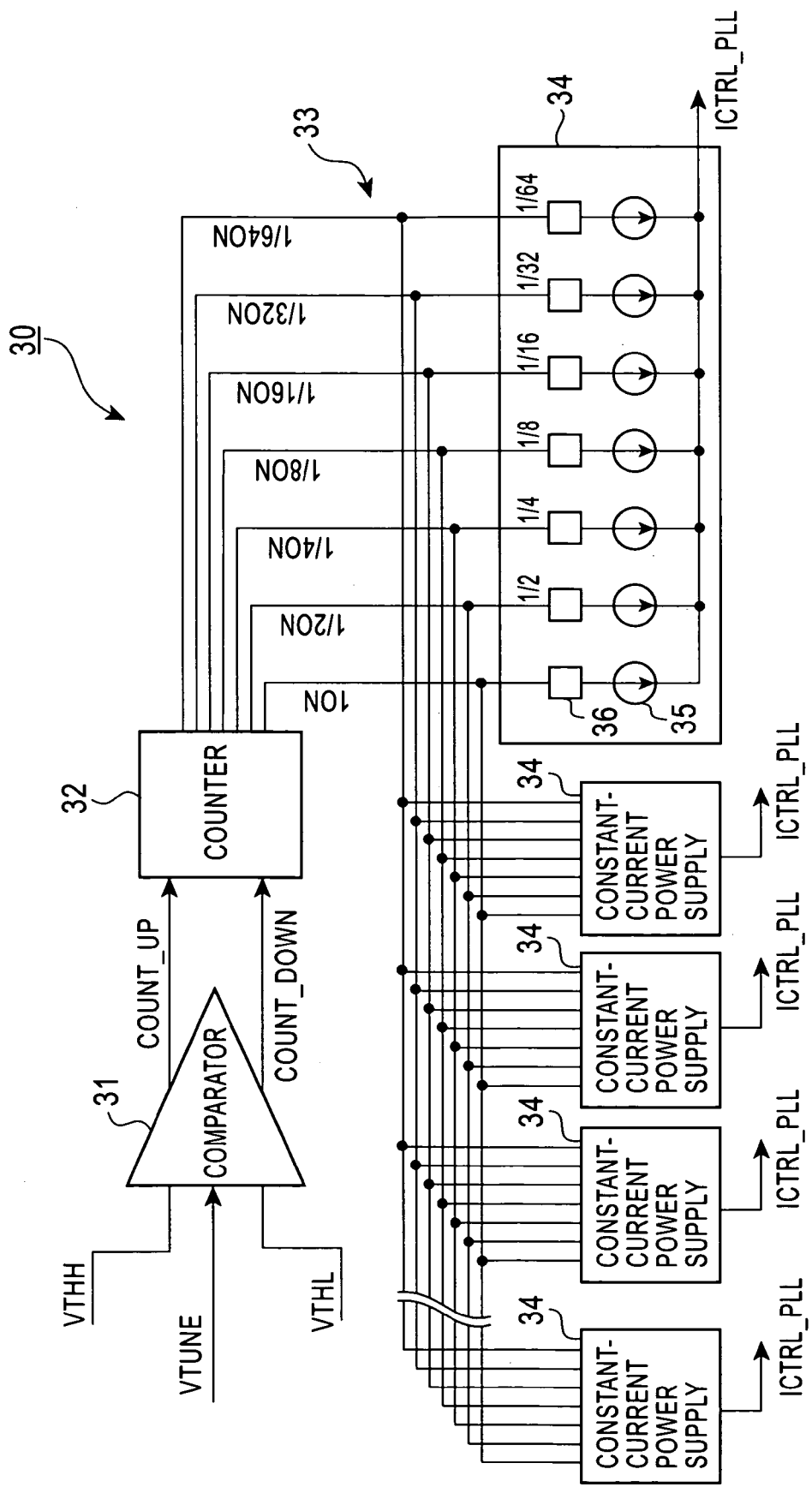
FIG. 3 is a schematic diagram of a voltage-to-current converter shown in FIG. 2 according to an exemplary embodiment.

FIG. 3 is a schematic diagram showing an exemplary embodiment of the voltage-to-current converter shown in FIG. 2. According to various exemplary embodiments, a voltage-to-current converter 30 includes a comparator 31, a counter 32, and a current distribution circuit 33. The current distribution circuit 33 may include a plurality of constant-current power supplies 34. As shown in FIG. 3, each of the constant-current power supplies 34 has a plurality of current elements 35 that may flow relative amounts of currents equal to 1, ½, ¼, ⅛, 1/16, 1/32, and 1/64, and switches 36 for switching on and off the current elements 35.

According to various exemplary embodiments, when the comparator 31 receives predetermined reference voltages VTHH and VTHL and a control voltage VTUNE, the comparator 31 then compares the reference voltages to the control voltage. If the control voltage VTUNE is larger than the reference voltage VTHH, the comparator 31 may output a count up signal. COUNT_UP; if the control voltage VTUNE is smaller than the reference voltage VTHL, the comparator 31 may output a count down signal COUNT_DOWN.

The counter 32 may output control signals 1ON, ½ON, . . . , 1/64ON for switching the current elements 35 included in the constant-current power supplies 34 on or off on the basis of the count up signal COUNT_UP or the count down signal COUNT_DOWN from the comparator 31.

According to various exemplary embodiments, the current elements 35 generate currents by being switched on by the corresponding switches 36 receiving the control signals 1ON, ½ON, . . . , 1/64ON from the counter 32, and the currents generated from the current elements 35 are then summed. The total current is output as the frequency control currents ICTRL_PLL for controlling the oscillator 25 from the constant-current power supplies 34. The number of constant-current power supplies 34 may be the same as that of CDR circuits. All the constant-current power supplies 34 may be controlled by the single counter 32. The current distribution circuit 33 delivers the frequency control currents ICTRL_PLL, which are controlled by the counter 32 and have the same current value, to the CDR circuits.

Figure 4:
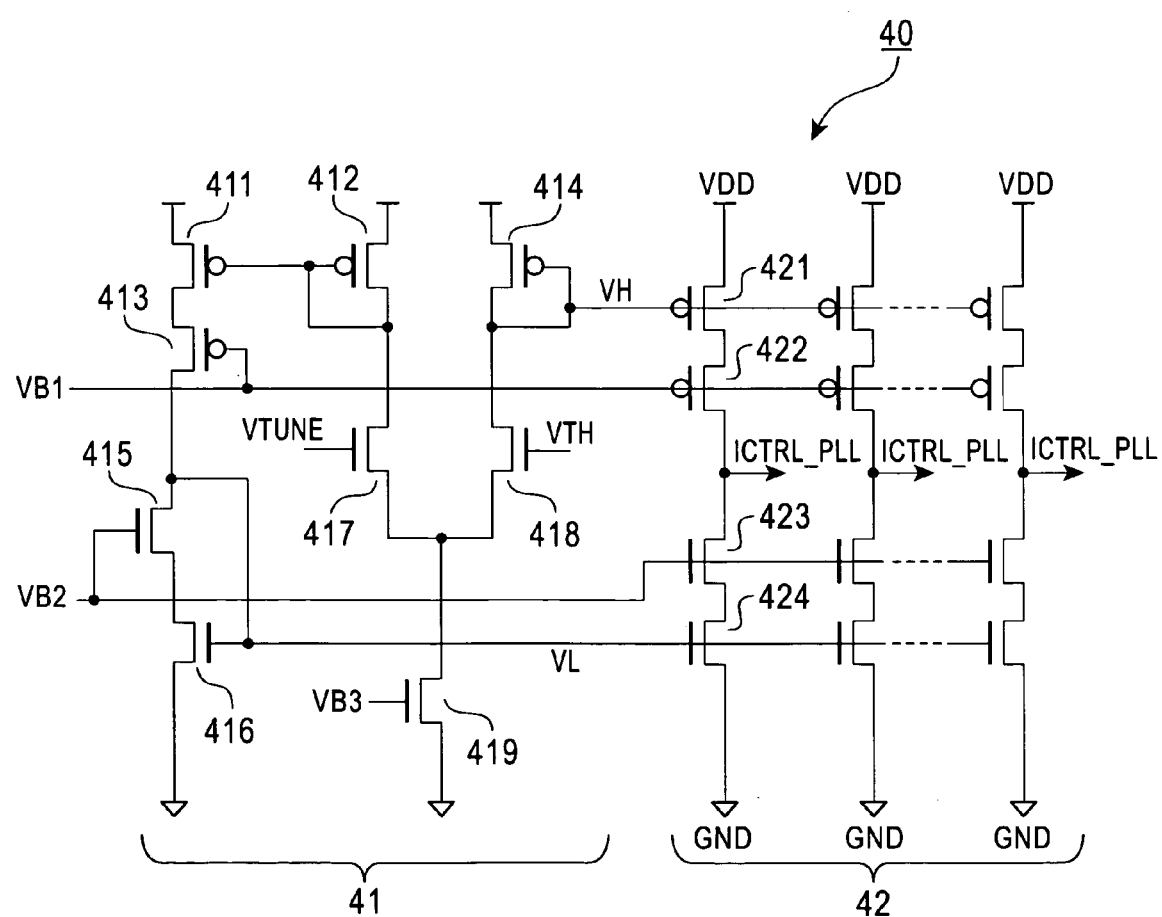
FIG. 4 is a schematic diagram of another voltage-to-current converter according to an exemplary embodiment.

FIG. 4 is a schematic diagram showing another exemplary embodiment of the voltage-to-current converter. According to various exemplary embodiments, a voltage-to-current converter 40 shown in FIG. 4 includes a differential amplifier 41 and a current mirror 42 for delivering the currents to the CDR circuits. The differential amplifier 41 may generate voltages VH and VL on the basis of the difference between a predetermined reference voltage VTH and a control voltage VTUNE. For example, if the control voltage VTUNE is larger than the reference voltage VTH, a current that passes through a p-channel metal-oxide semiconductor transistor (hereinafter referred to as PMOS) 412, an n-channel metal-oxide semiconductor transistor (hereinafter referred to as NMOS) 417, and an NMOS 419 is larger than a current that passes through a PMOS 414, an NMOS 418, and the NMOS 419, and therefore, the levels of the voltages VH and VL increase. In contrast to this, if the control voltage VTUNE is smaller than the reference voltage VTH, the levels of the voltages VH and VL decrease. In FIG. 4, VB1, VB2, and VB3 represent bias voltages.

According to various exemplary embodiments, the current mirror 42 includes a plurality of constant-current power supplies having the same shape. Each of the constant-current power supplies includes a PMOS 421, a PMOS 422, an NMOS 423, and an NMOS 424 connected in series between a power supply VDD and a ground GND. The voltage VH may be input to a gate of the PMOS 421, and the voltage VL may be input to a gate of the NMOS 424. In accordance with the levels of the voltages VH and VL, a frequency control current ICTRL_PLL may be output from an output terminal in which a drain of the PMOS 422 and a drain of the NMOS 423 are connected to each other. As described above, in the current mirror 42, the frequency control current may be controlled on the basis of the voltages VH and VL input from the differential amplifier 41, and the frequency control currents ICTRL_PLL, which have the same current value as each other and are of the same number as the CDR circuits, are generated and delivered.

In the exemplary embodiments described above, the oscillator (OSC) in the PLL circuit is a known current-controlled oscillator (ICO). However, the oscillator in the PLL circuit may be a voltage-controlled oscillator (VCO) that is controlled on the basis of the control voltage VTUNE. In the case of the voltage-controlled oscillator, the control voltage VTUNE shown in FIG. 2 may be input directly to the voltage-controlled oscillator and also input to the voltage-to-current converter. The voltage-to-current converter may generate the frequency control currents ICTRL_PLL, which have the same current value as each other and are of the same number as the CDR circuits.

Each of the phase-frequency detector, the charge pump, the loop filter, and the frequency divider may be a known device. The voltage-to-current converter may be a combination of the exemplary embodiments described above, and may be a combination of a known device and current mirrors which are of the same number as the CDR circuits.

Figure 5:
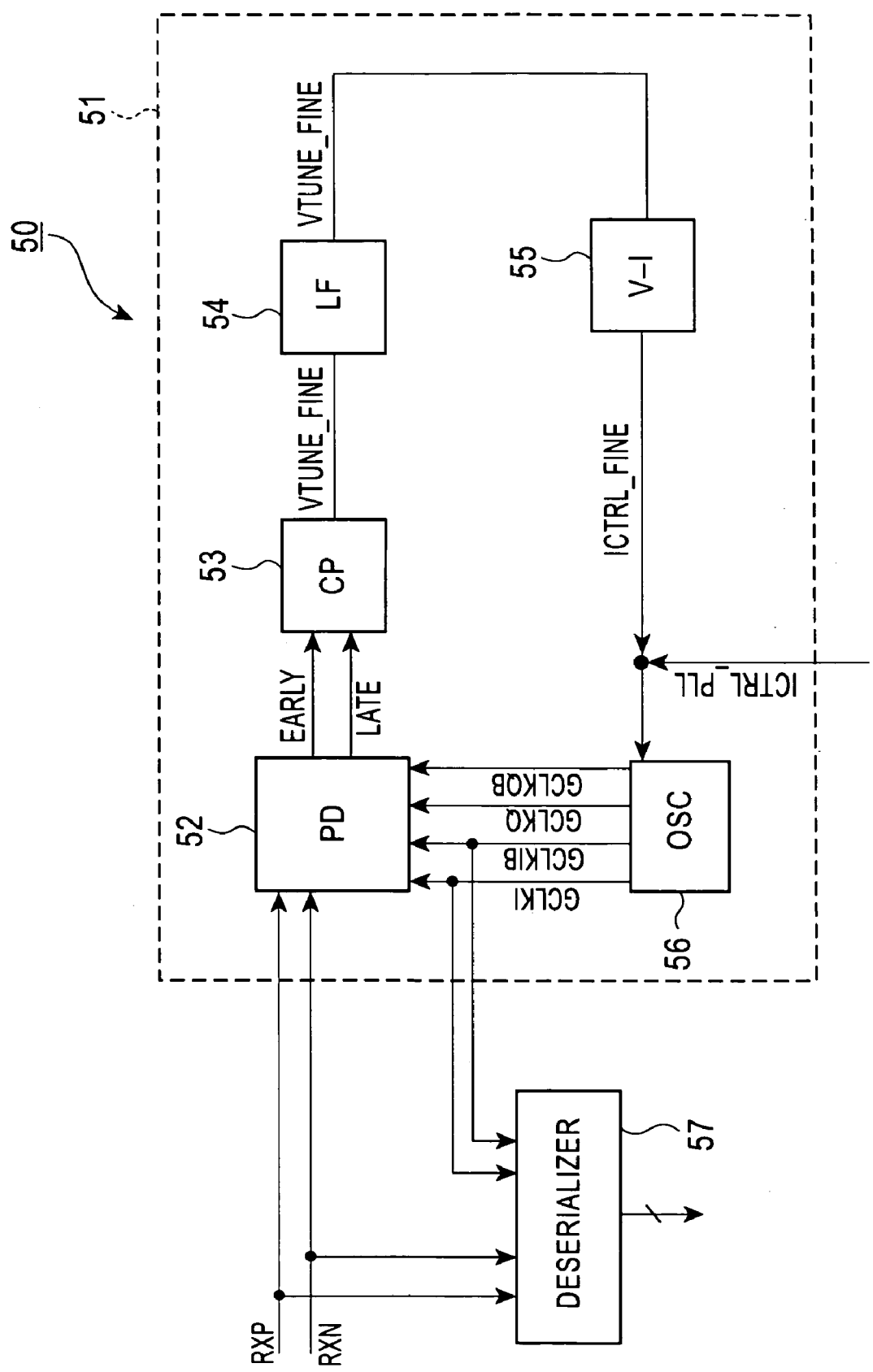
FIG. 5 is a schematic diagram of a serial-to-parallel converter included in the semiconductor integrated circuit according to an exemplary embodiment.

FIG. 5 is a schematic diagram showing an exemplary embodiment of a serial-to-parallel converter included in the semiconductor integrated circuit. According to various exemplary embodiments, a serial-to-parallel converter (S/P) 50 includes a deserializer 57 and a CDR circuit 51 having a phase detector (PD) 52, a charge pump (CP) 53, a loop filter (LF) 54, a voltage-to-current converter (V-I) 55, and an oscillator (OSC) 56.

The phase detector 52 may compare the phases of clocks GCLKI, GCLKQ, GCLKIB, and GCLKQB with the phases of serial data signals RXP and RXN. If the phases of the clock signals are earlier, the phase detector 52 outputs an early signal EARLY; if the phases of the clock signals are later, the phase detector 52 outputs a late signal LATE. The charge pump 53 outputs a control voltage VTUNE_FINE on the basis of the early signal EARLY or the late signal LATE. The control voltage VTUNE_FINE may be smoothed in the loop filter 54 and then converted into a frequency control current ICTRL_FINE in the voltage-to-current converter 55. The oscillator 56 may then receive a total current of the frequency control current ICTRL_FINE and the frequency control current ICTRL_PLL, which is supplied from the PLL circuit as a mirrored current. The high-speed clocks GCLKI and GCLKIB, whose phases have been adjusted in this way, may be transmitted to the deserializer 57. The deserializer 57 may convert serial data into parallel data in synchronism with the high-speed clocks GCLKI and GCLKIB.

Whereas a known CDR circuit includes a coarse loop and a fine loop, the CDR circuit in various exemplary embodiments requires no circuit for such a coarse loop. Therefore, both the layout area and power consumption can be reduced. Additionally, the frequency gain of the oscillator 56 can be smaller than that in the oscillator used in the PLL circuit. In this case, the occurrence of jitter can be reduced.

Figure 6:
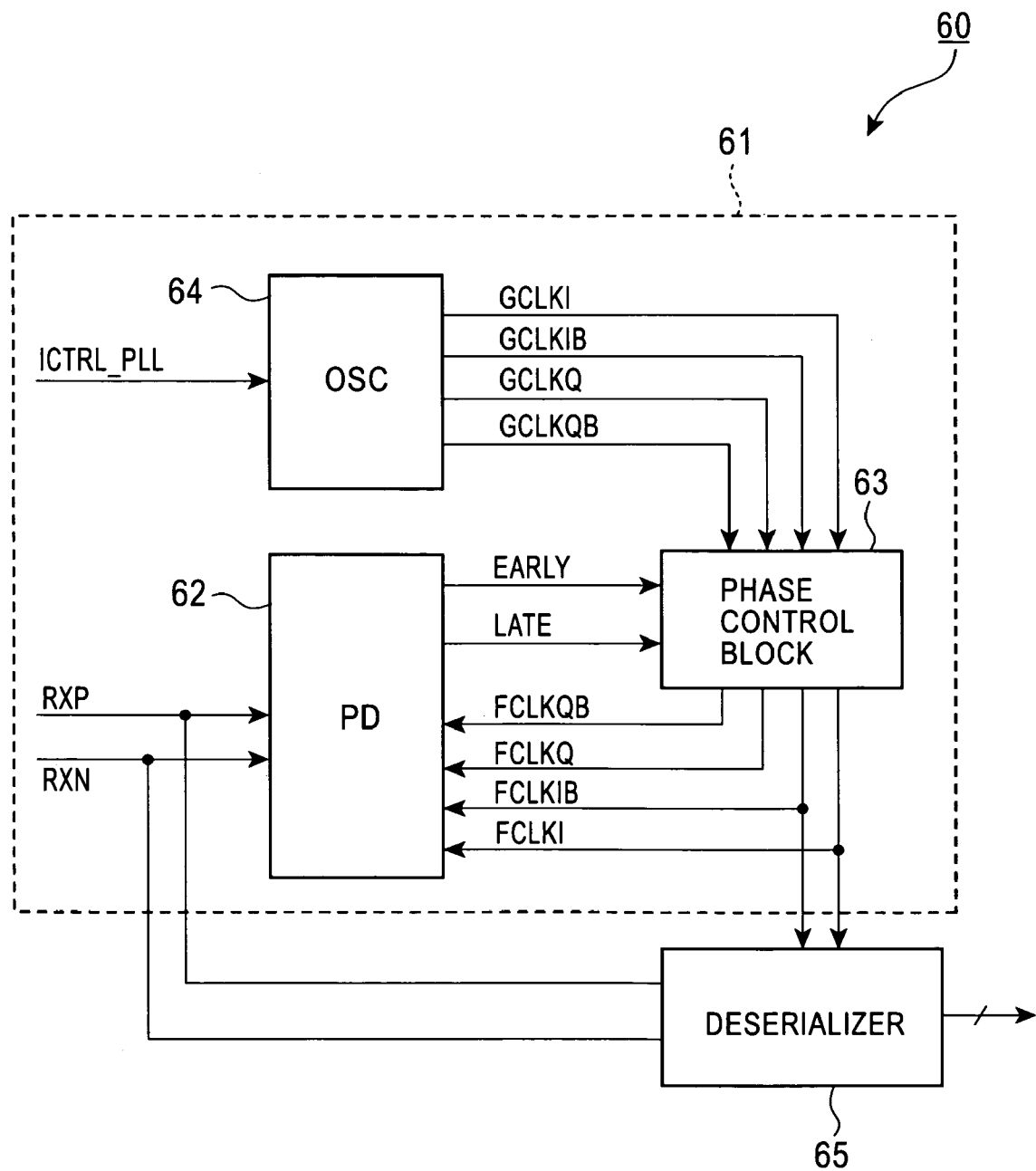
FIG. 6 is a schematic diagram of another serial-to-parallel converter included in the semiconductor integrated circuit according to an exemplary embodiment.
Figure 7:
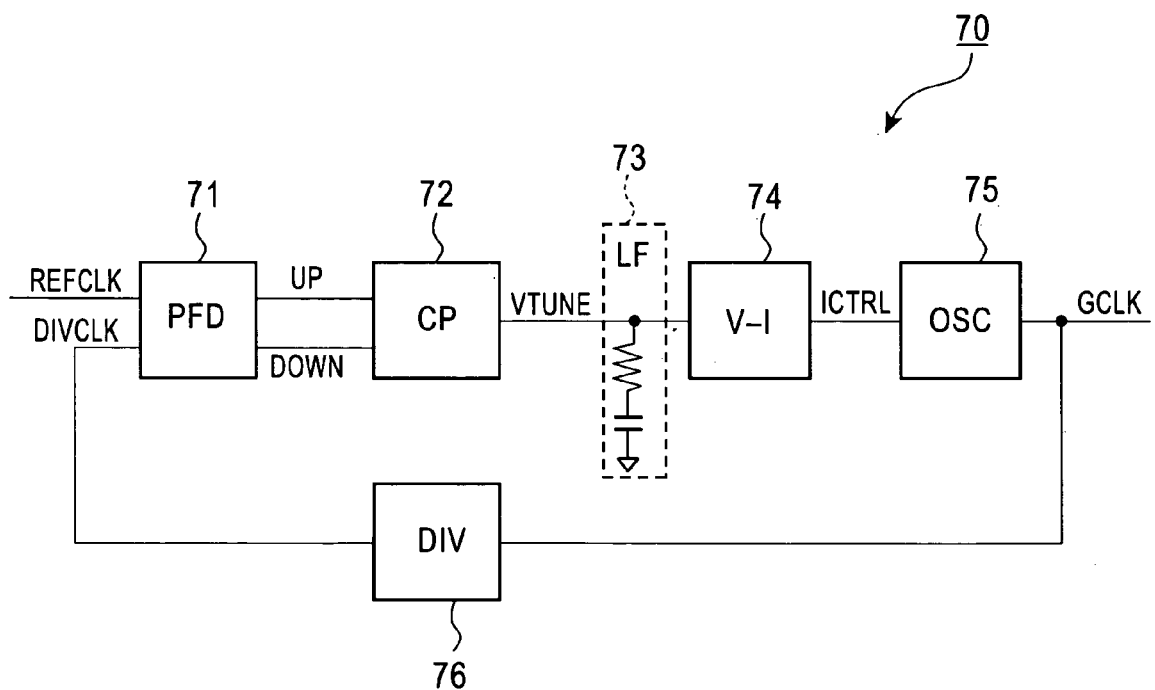
FIG. 7 is a schematic diagram of a conventional typical PLL circuit.
Figure 8:
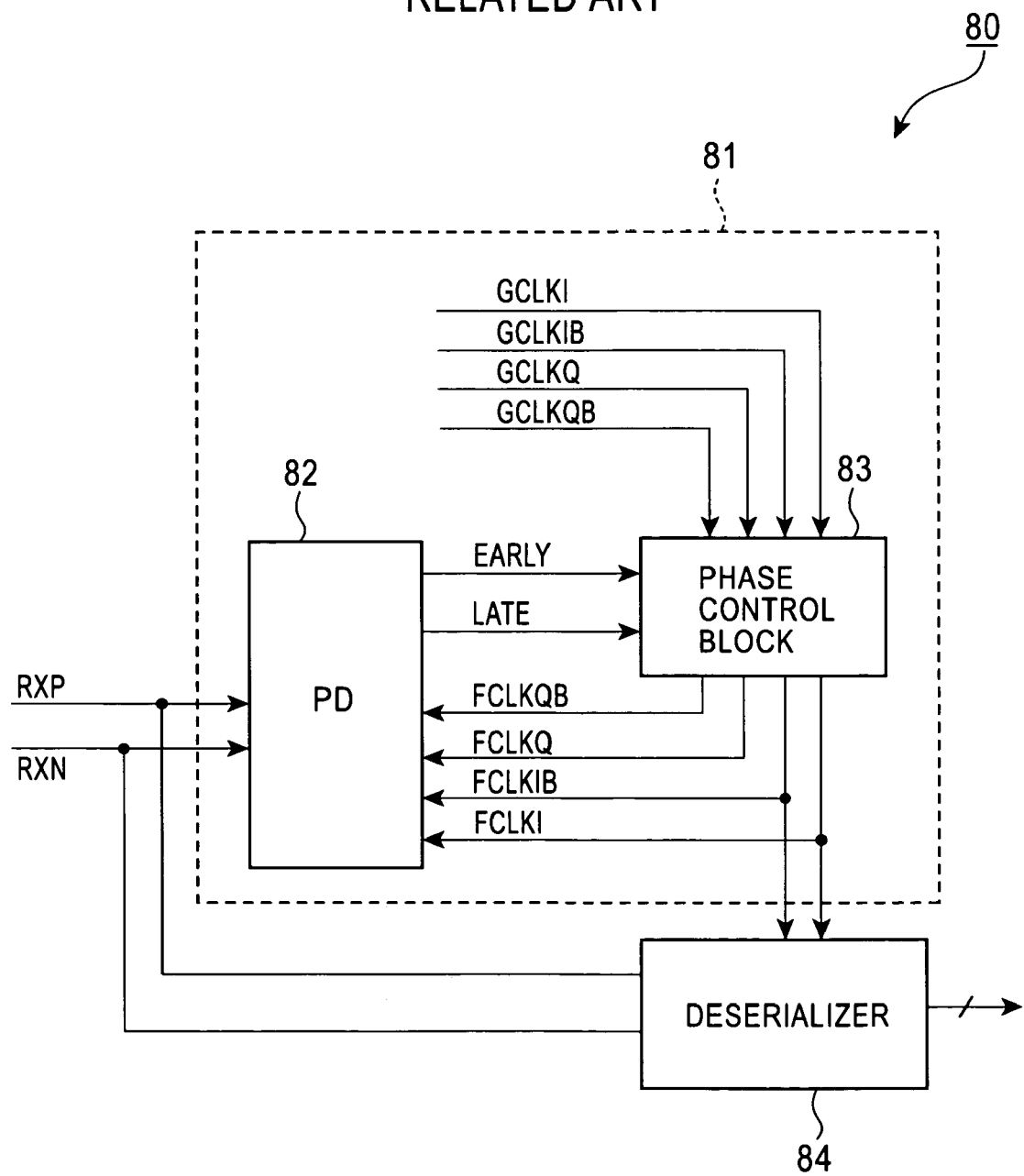
FIG. 8 is a schematic diagram of a conventional typical serial-to-parallel converter.
Figure 9:
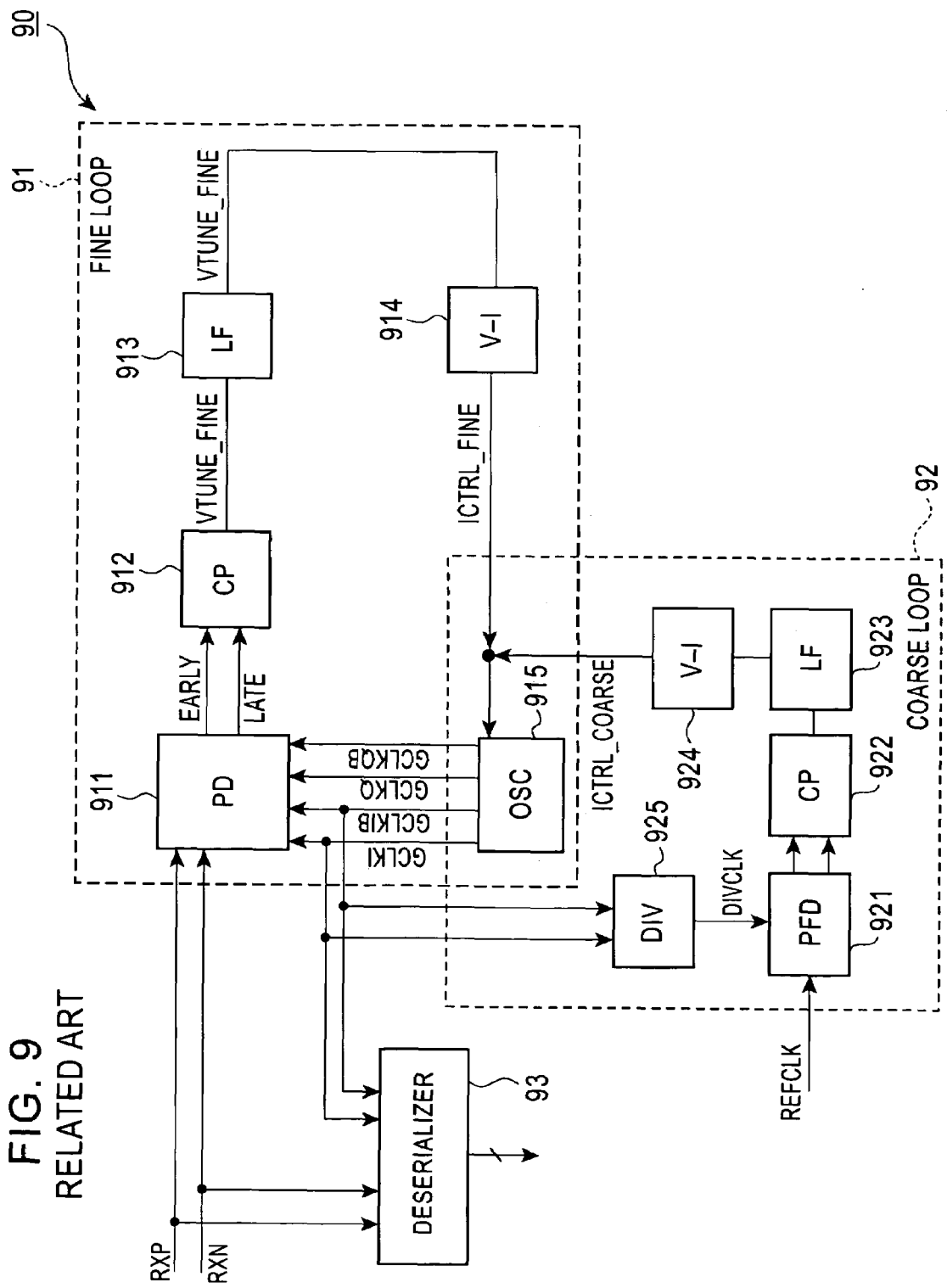
FIG. 9 is a schematic diagram of another conventional typical serial-to-parallel converter.
Figure 10:
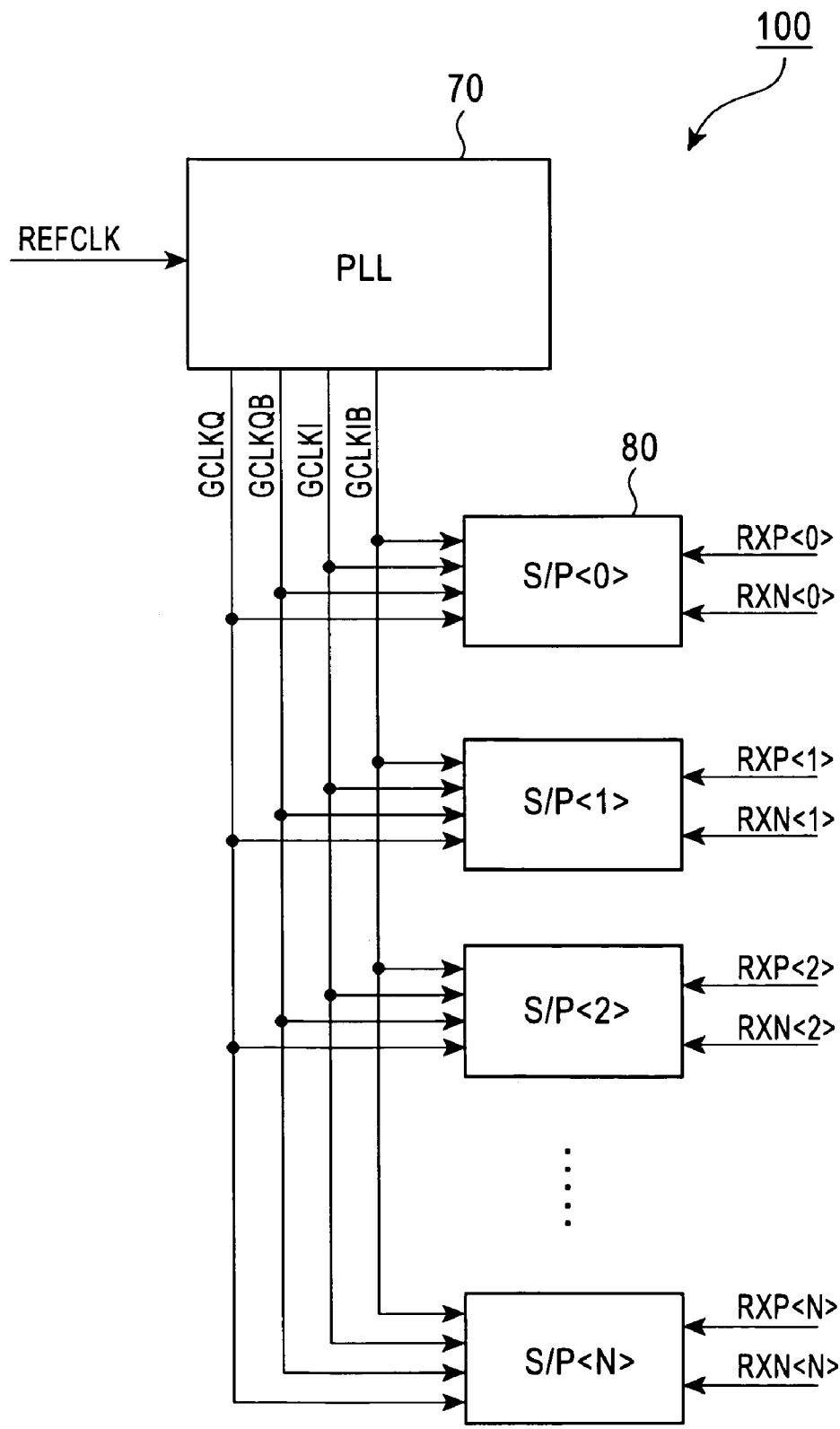
FIG. 10 is a diagram illustrating a conventional method of supplying clocks to a plurality of channels.
Figure 11:
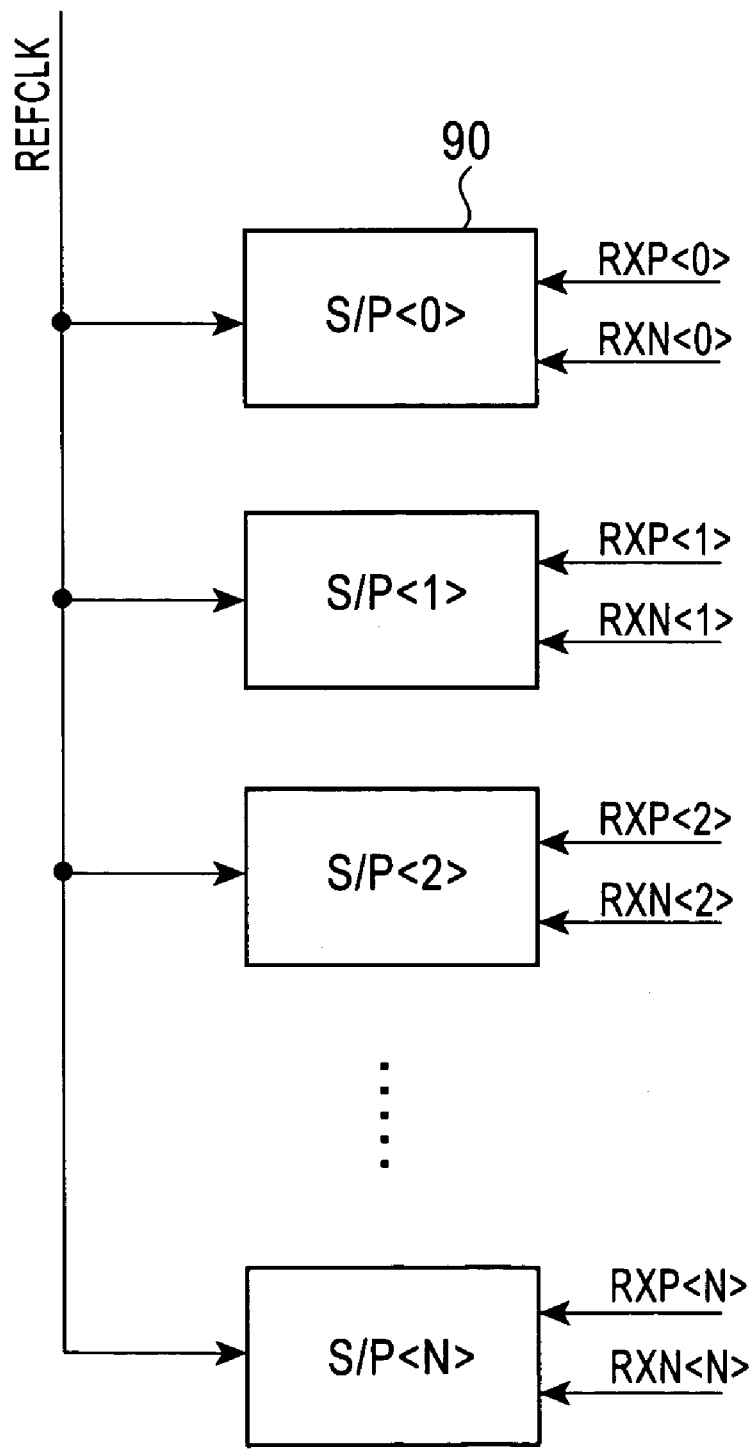
FIG. 11 is a diagram illustrating a conventional method of providing commonality among reference clocks in serial links.

FIG. 6 is a schematic diagram showing another exemplary embodiment of the serial-to-parallel converter included in the semiconductor integrated circuit. According to various exemplary embodiments, a serial-to-parallel converter (S/P) 60 shown in FIG. 6 includes a deserializer 65 and a CDR circuit 61 having an oscillator (OSC) 64, a phase detector (PD) 62, and a phase control block 63. Since the oscillator 64 receives the frequency control current ICTRL_PLL from the PLL circuit, the oscillator 64 oscillates with the same frequency with which the oscillator in the PLL circuit oscillates. The phase control block 63 may perform an adjustment on the basis of an early signal EARLY and a late signal LATE input from the phase detector 62 such that the phases of clocks GCLKI, GCLKQ, GCLKIB, and GCLKQB become coincident with the phases of serial data signals RXP and RXN. High-speed clocks FCLKI and FCLKIB, whose phases have been adjusted in this way, may be transmitted to the deserializer 65. The deserializer 65 may convert serial data into parallel data in synchronism with the high-speed clock signals FCLKI and FCLKIB.

The oscillator 64 may be a general current-controlled oscillator. Alternatively, the oscillator 64 may be an oscillator whose frequency gain is smaller than that in the oscillator used in the PLL circuit. In this case, the occurrence of jitter can be reduced. Each of the phase control block 63 and the phase detector 62 can be a known device.

The CDR circuit may be of any type as long as the CDR circuit controls the frequency of the oscillator on the basis of the frequency control current ICTRL_PLL received from the PLL circuit. For example, the CDR circuit may be a combination of the two exemplary embodiments described above or may be a known device. Additionally, the CDR circuit may include a current-to-voltage converter configured to convert the supplied frequency control current ICTRL_PLL into a control voltage, so that the oscillator can be a voltage-controlled circuit.

While the semiconductor integrated circuit according to various exemplary embodiments of the present invention has been described with reference to these embodiments, it is to be understood that the invention is not limited to the disclosed exemplary embodiments. It is apparent that changes and modifications may be made without departing from the sprit and scope of the claimed invention.

What is claimed is:

1. A semiconductor integrated circuit comprising:
   a phase-locked loop (PLL) circuit configured to generate an oscillation output signal synchronized with a reference clock, the PLL circuit including:
   a phase-frequency detector;
   a charge pump;
   a loop filter;
   an oscillator; and
   a voltage-to-current converter configured to convert a control voltage output from the loop filter and to control an oscillation frequency of the oscillator into a current;
   a plurality of clock and data recovery (CDR) circuits configured to adjust a phase of the oscillation output signal with respect to a phase of serial data; and
   a path for distributing the converted current to the plurality of CDR circuits.

2. The semiconductor integrated circuit according to claim 1, wherein each one of the plurality of CDR circuits includes an oscillator having an oscillation frequency that is controlled on the basis of the distributed current.

3. The semiconductor integrated circuit according to claim 1, wherein each one of the plurality of CDR circuits includes a current-to-voltage converter configured to convert the distributed current into a voltage and a voltage-controlled oscillator having an oscillation frequency that is controlled on the basis of the converted voltage.

4. The semiconductor integrated circuit according to claim 1, wherein the PLL circuit includes a current-controlled oscillator whose oscillation frequency is controlled on the basis of the current converted by the voltage-to-current converter.

5. The semiconductor integrated circuit according to claim 1, wherein the PLL circuit includes a voltage-controlled oscillator having an oscillation frequency that is controlled on the basis of the control voltage output from the loop filter.

6. The semiconductor integrated circuit according to claim 1, wherein the voltage-to-current converter includes a comparator configured to compare the control voltage with a predetermined voltage, and a plurality of constant-current power supplies configured to supply currents to the plurality of CDR circuits on the basis of comparison performed by the comparator.

7. The semiconductor integrated circuit according to claim 2, wherein each one of the plurality of CDR circuits includes a phase control block configured to perform adjustment on the basis of the distributed current such that a phase of a clock generated in the oscillator in the CDR circuit is coincident with a phase of the serial data, and a phase detector configured to compare the phases of the adjusted clock and the serial data and control the phase control block.

8. The semiconductor integrated circuit according to claim 7, further comprising:
a deserializer configured to convert the serial data into parallel data by using the adjusted clock output from the CDR circuit.

9. The semiconductor integrated circuit according to claim 2, wherein each one of the plurality of CDR circuits constitutes a fine loop including a phase detector, a charge pump, a loop filter, a voltage-to-current converter, and the oscillator, and the fine loop is configured to perform an adjustment on the basis of the distributed current and a current converted by the voltage-to-current converter in the fine loop such that a phase of a clock generated in the oscillator is coincident with a phase of the serial data.

10. The semiconductor integrated circuit according to claim 9, further comprising:
a deserializer configured to convert the serial data into parallel data by using the adjusted clock output from the CDR circuit.

* * * * *